United States Patent
Saijyo et al.

(10) Patent No.: US 6,927,078 B2
(45) Date of Patent: Aug. 9, 2005

(54) METHOD OF MEASURING CONTACT RESISTANCE OF PROBE AND METHOD OF TESTING SEMICONDUCTOR DEVICE

(75) Inventors: Masakatsu Saijyo, Tokyo (JP); Toshiaki Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 35 days.

(21) Appl. No.: 10/648,343

(22) Filed: Aug. 27, 2003

(65) Prior Publication Data

US 2004/0041581 A1 Mar. 4, 2004

(30) Foreign Application Priority Data

Aug. 27, 2002 (JP) ........................................ 2002-247197

(51) Int. Cl.⁷ .............................................. H01L 21/66
(52) U.S. Cl. .................... 438/10; 438/11; 257/E21.523; 257/E21.525; 257/E21.531
(58) Field of Search .............. 438/10, 11; 257/E21.523, 257/E21.525, E21.531

(56) References Cited

U.S. PATENT DOCUMENTS

| | | | | |
|---|---|---|---|---|
| 3,881,964 A | * | 5/1975 | Cresswell et al. ............ 438/10 |
| 4,197,632 A | * | 4/1980 | Aomura ........................ 438/11 |
| 4,440,799 A | * | 4/1984 | Faith, Jr. ...................... 438/18 |
| 6,087,895 A | | 7/2000 | Ono | |
| 6,265,245 B1 | * | 7/2001 | Farnworth et al. ........... 438/107 |
| 6,320,397 B1 | * | 11/2001 | Wood et al. ................. 324/755 |

FOREIGN PATENT DOCUMENTS

| | | |
|---|---|---|
| JP | 09-275191 | 10/1997 |
| JP | 10-107104 | 4/1998 |
| JP | 10-209231 | 8/1998 |

* cited by examiner

*Primary Examiner*—George Fourson
*Assistant Examiner*—Joannie Adelle Garcia
(74) *Attorney, Agent, or Firm*—Rabin & Berdo, P.C.

(57) ABSTRACT

A measuring method of the contact resistance of a probe includes bringing a plurality of probes including a first and second probes into contact with a plurality of electrode pads that is disposed on a semiconductor device to be electrically tested and connected each other with a conductive wiring; connecting a power supply to at least one predetermined first probe of the plurality of probes and supplying a current or a voltage from the first probe through the electrode pad and the wiring to the second probe to the semiconductor device; measuring the contact resistance between the electrode pad and the probe based on the current or the voltage supplied to the semiconductor device; judging whether the measured contact resistance is equal to or more than a predetermined value or not; and when the contact resistance is equal to or more than the predetermined value, the probes are cleansed.

17 Claims, 8 Drawing Sheets

METHOD OF MEASURING CONTACT RESISTANCE OF PROBE AND METHOD OF TESTING SEMICONDUCTOR DEVICE

BACKGROUND OF THE INVENTION

The present invention relates to a method of measuring contact resistance of a probe and a method of testing a semiconductor device, in more detail, relates to a method of measuring contact resistance of a probe that is used in testing a semiconductor device and a method of testing a semiconductor device.

When a semiconductor device formed on a wafer is tested, a probe card provided with a plurality of needles that is called a probe is used. One end of the probe is connected to measuring means such as a tester or the like, the other end thereof is brought into contact with an electrode pad of a semiconductor device, and thereby an electrical test of the semiconductor device is performed.

Measurement results of such test are largely influenced by contact resistance between a tip end of the probe and the electrode pad. Accordingly, so far, when irregularity in the contact resistance is surmised during the test or a periodical maintenance operation is performed, a device dedicated for contact resistance measurement has been used to measure.

The dedicated device includes a stage provided with a measuring stage that is formed of a conductive member such as gold and grounded; and a cleaning stage made of a polishing member; wherein the probe is brought into contact with the measuring stage to supply an electric current to the probe, a voltage of the probe is measured, and thereby the contact resistance is obtained. When a measurement value exceeds a management criterion, a tip end of the probe is polished at the cleaning stage, and thereby contacting properties between the probe and the electrode pad are recovered.

However, when the contact resistance is measured with a dedicated device such as mentioned above, a probe card has to be removed from the test device during the test of a wafer and set to a device dedicated for contact resistance measurement, accordingly, there is a problem in that test efficiency is lowered.

Furthermore, during the test of a wafer, a contact resistance value between the probe and the electrode pad of a semiconductor device to be tested cannot be monitored. Accordingly, there is a problem in that, without noticing the abnormality of the contact resistance value, the test may be continued, and a decrease in the yield may result.

Furthermore, since the contact resistance is measured by use of the dedicated device instead of measuring the contact resistance with a wafer that is actually under test, the contact resistance may differ in some cases from an actual contact resistance; that is, there is a problem in that the contact resistance cannot be accurately measured.

The present invention is carried out in view of the above facts and intends to provide a measuring method of the contact resistance of a probe that allows suppressing test efficiency from lowering and measuring accurately the contact resistance; and a method of testing a semiconductor device.

SUMMARY OF THE INVENTION

A measuring method of the contact resistance of a probe of the present invention includes bringing a plurality of probes including a first and second probes into contact with a plurality of electrode pads that is disposed on a semiconductor device to be electrically tested and connected each other with a conductive wiring; connecting a power supply to at least one predetermined first probe of the plurality of probes and supplying a current or a voltage from the first probe through the electrode pad and the wiring to the second probe to the semiconductor device; measuring the contact resistance between the electrode pad and the probe based on the current or the voltage supplied to the semiconductor device; judging whether the measured contact resistance is equal to or more than a predetermined value or not; and when the contact resistance is equal to or more than the predetermined value, the probes are cleansed.

DESCRIPTION OF THE PREFERRED EMBODIMENTS (First Embodiment)

In the following, with reference to the drawings, a first embodiment according to the invention will be explained.

Figure 1:
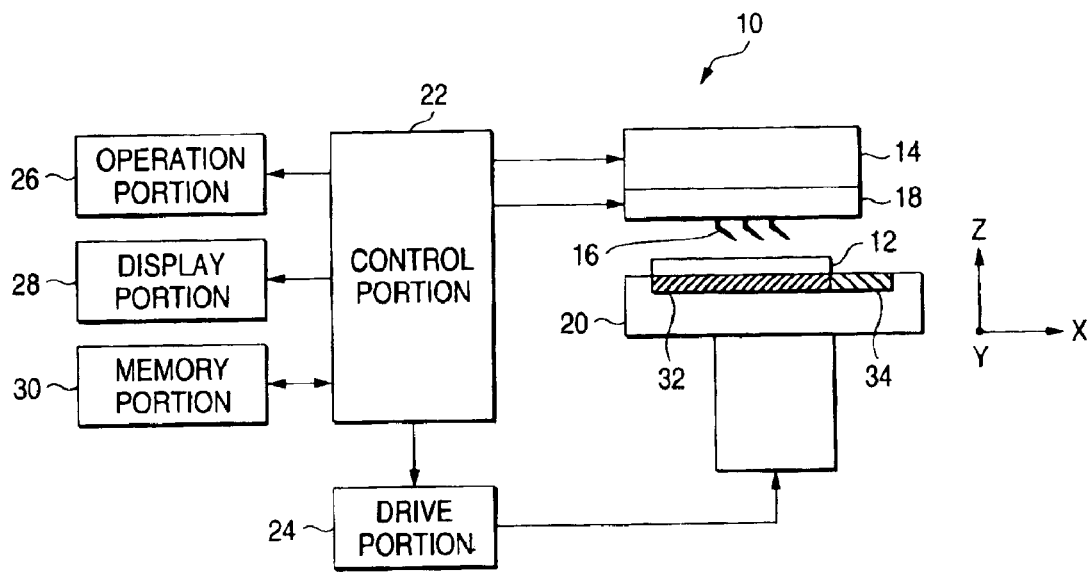
FIG. 1 is a schematic block diagram of a prober according to a first embodiment.

In FIG. 1, a schematic block diagram of a prober 10 according to the present embodiment is shown. The prober 10 includes a tester 14 that tests electric characteristics of a semiconductor device (such as CPU, RAM and ROM) formed on a wafer 12 to be tested and measures contact resistance thereof described later; a probe card 18 that, with connected to the tester 14 and with the probe 16 brought into contact with the electrode pad of the semiconductor device, electrically connects the semiconductor device and the tester 14; and a table 20 or the like that moves the wafer 12 so that the probe 16 may come into contact with the electrode pad of the semiconductor device.

The tester 14 and the probe card 18 are controlled with a control portion 22. The table 20 is controlled through a drive portion 24 with the control portion 22. The drive portion 24 drives the table 20 in up and down direction and in left and right direction. That is, the drive portion 24 can move the table 20 in an X-axis direction, a Y-axis direction perpendicular to the X-axis direction, and a Z-axis direction perpendicular to both the X-axis and Y-axis direction shown in FIG. 1, and circularly with the Z-axis at a center.

To the control portion 22, an operation portion 26 that inputs operation instructions and various kinds of parameters; a display portion 28 that displays test results of the wafer 12 and measurements of the contact resistances between the probe 16 and the electrode pad of the semiconductor device; and a memory portion 30 that memorizes a control program described later and design information of the wafer 12 to be tested are connected, and thereby an overall control is applied.

Figure 2:
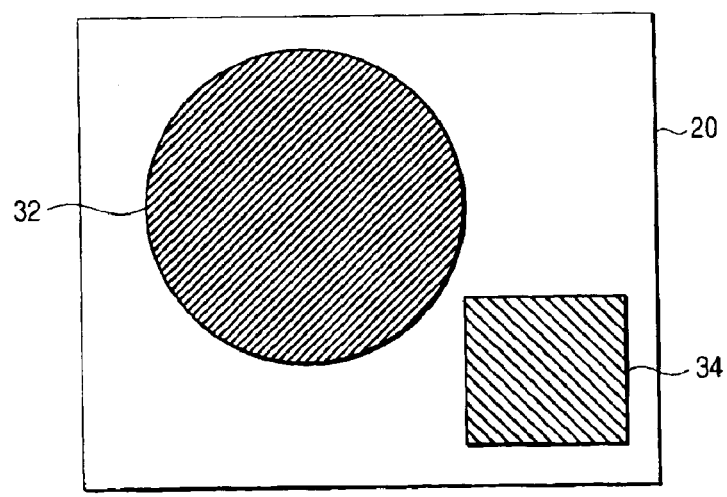
FIG. 2 is a plan view of a table.

The table 20, as shown in FIG. 2, includes a wafer stage 32 that is a supporting area thereon the wafer 12 is disposed; and a cleaning stage 34 that is a cleaning area formed of abrasive or the like for cleansing the probe 16. When the probe 16 is cleansed, the control portion 22 moves the table 20 so that the probe 16 may be positioned on the cleaning stage 34, brings the probe 16 into contact with the cleaning stage 34, and thereby the probe 16 is cleansed.

Figure 3:
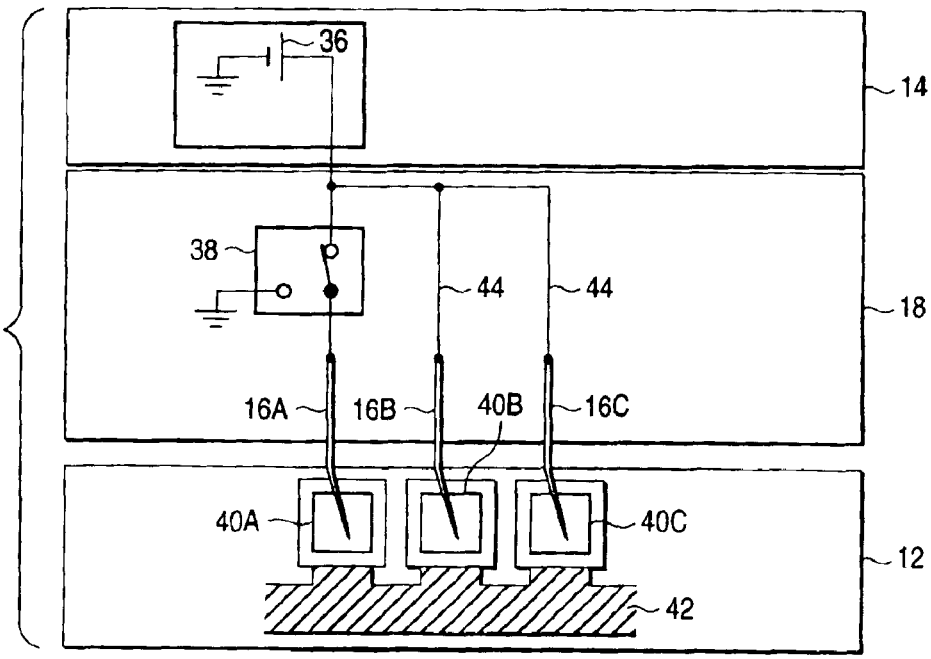
FIG. 3 is a diagram schematically showing connection relationship between a tester, a probe card, and an electrode pad of a semiconductor device at the time of test according to a first embodiment.

In FIG. 3, connection relationship between the tester 14, the probe card 18 and the wafer 12 at the time of test of the wafer 12 is schematically shown.

As shown in FIG. 3, the tester 14, at the time of test of the wafer 12, that is, when a semiconductor device is electrically tested, functions as a voltage supply 36. The probe card 18 includes a relay 38 as connecting means and probes 16A through 16C. To the wafer 12, as apart of the semiconductor device, electrode pads 40A through 40C for use in power supply are connected with a conductive wiring 42.

In the present embodiment, a case where the probe card 18 includes three probes 16A through 16C, and the semiconductor device formed on the wafer 12 includes electrode pads 40A through 40C will be explained.

The semiconductor device includes a plurality of modules (blocks), and, in some cases, in a state of wafer, a plurality of electrode pads for supplying power to the respective modules is connected with a conductive wiring, and, actually in many cases, the electrode pads 40A through 40C are separated. However, in the embodiment, for the sake of convenience, as shown in FIG. 3, the electrode pads 40A through 40C are explained as adjacently located each other.

One end of each of the probes 16B and 16C is connected through a conductive wiring 44 to a plus side of the voltage source 36 of the tester 14, and one end of the probe 16A is connected to the relay 38.

The relay 38, at the time of testing the semiconductor device, as shown in FIG. 3, connects the probe 16A and a power supply (the voltage supply 36 of the tester 14) that is used to test the semiconductor device, and, at the time of measuring the contact resistance between the probe and the electrode pad, grounds the probe 16A.

In the above, the power supply 36 corresponds to a second power supply according to the invention, the probes 16B and 16C to the first probes according to the invention, the probe 16A to the second probe according to the invention, and the control portion 22, drive portion 24 and the cleaning stage 34 to the cleaning means according to the invention.

When the semiconductor device is tested, the table 20 is controlled to move so that each of the other ends of the probes 16A through 16C may come into contact with corresponding electrode pads 40A through 40C, and thereby a operating voltage of the semiconductor device to be tested is supplied from the power supply 36 to all of the probes 16A through 16C. Thereby, a voltage of power supply potential is supplied to the electrode pads 40A through 40C that have come into contact with the probes 16A through 16C, and thereby the test of the semiconductor device is performed.

Thus, at the time of testing the semiconductor device, a voltage is supplied from the probes 16A through 16C to the electrode pads 40A through 40C; however, when this is repeated, owing to the contact pressure of the probe, aluminum or the like on a surface of the electrode pad is chipped away, melted because of a current flowing between the probe and the electrode pad, adheres to a tip end of the probe, and is oxidized. Thereby, the contact resistance between the probe and the electrode pad becomes high, resulting in, in some cases, incapability of accurately measuring. Accordingly, in order to accurately test, in addition to accurately measuring the contact resistance, the probe has to be cleansed before the contact resistance becomes high to the extent where measured contact resistance cannot be accurately tested.

Figure 4:
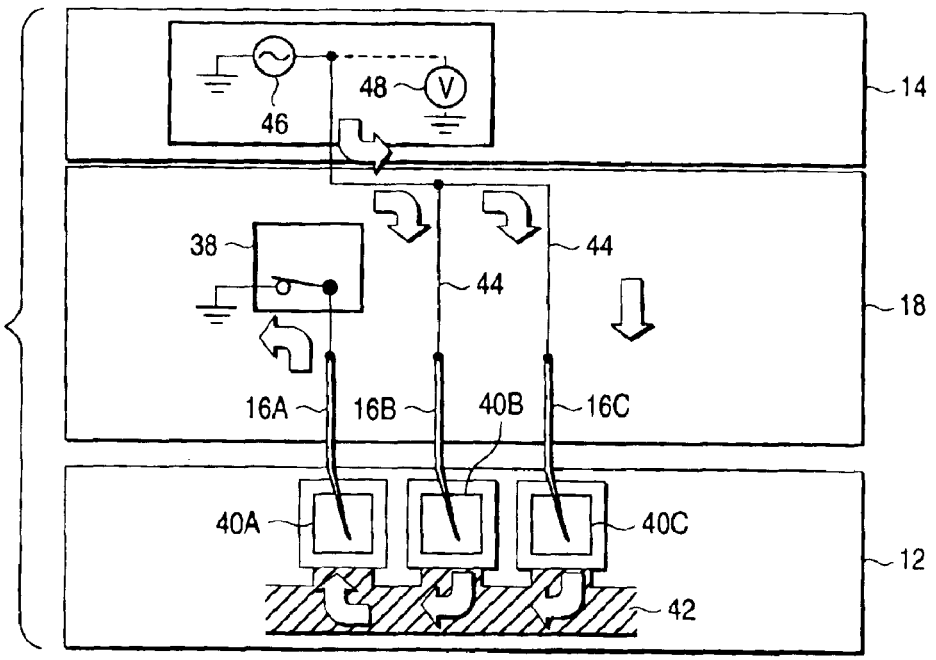
FIG. 4 is a diagram schematically showing connection relationship between a tester, a probe card, and an electrode pad of a semiconductor device at the time of contact resistance measurement according to a first embodiment.

In this connection, in the embodiment, as shown in FIG. 4, when the contact resistance between the probe and the electrode pad is measured, the control portion 22 controls the relay 38 so that the probe 16A may be grounded.

Furthermore, the tester 14, at the time of measuring the contact resistance, as shown in FIG. 4, functions as a current supply 46 that supplies a current for measuring the contact resistance to the probes 16B and 16C, and as a voltmeter 48 that measures voltages of the probe 16A and 16C. The current supply 46 corresponds to the first power supply according to the invention.

At the time of measurement of the contact resistance, a current for measuring the contact resistance flows in a direction shown in FIG. 4 with arrow marks. That is, the probe 16A is grounded through the relay 38 and thereby functions as a grounding probe; accordingly, a current supplied from a power supply connected to the one end of the probes 16B and 16C (a current source 46 of the tester 14) that is used when the contact resistance is measured flows in turn through the probes 16B and 16C as the probes for use in the power supply, the electrode pads 40B and 40C, the wiring 42, the electrode pad 40A, the probe 16A and the relay 38. A value of the current supplied from the current supply 46 is preferably determined in accordance with, for instance, an operating voltage of the semiconductor device to be tested.

Figure 5:
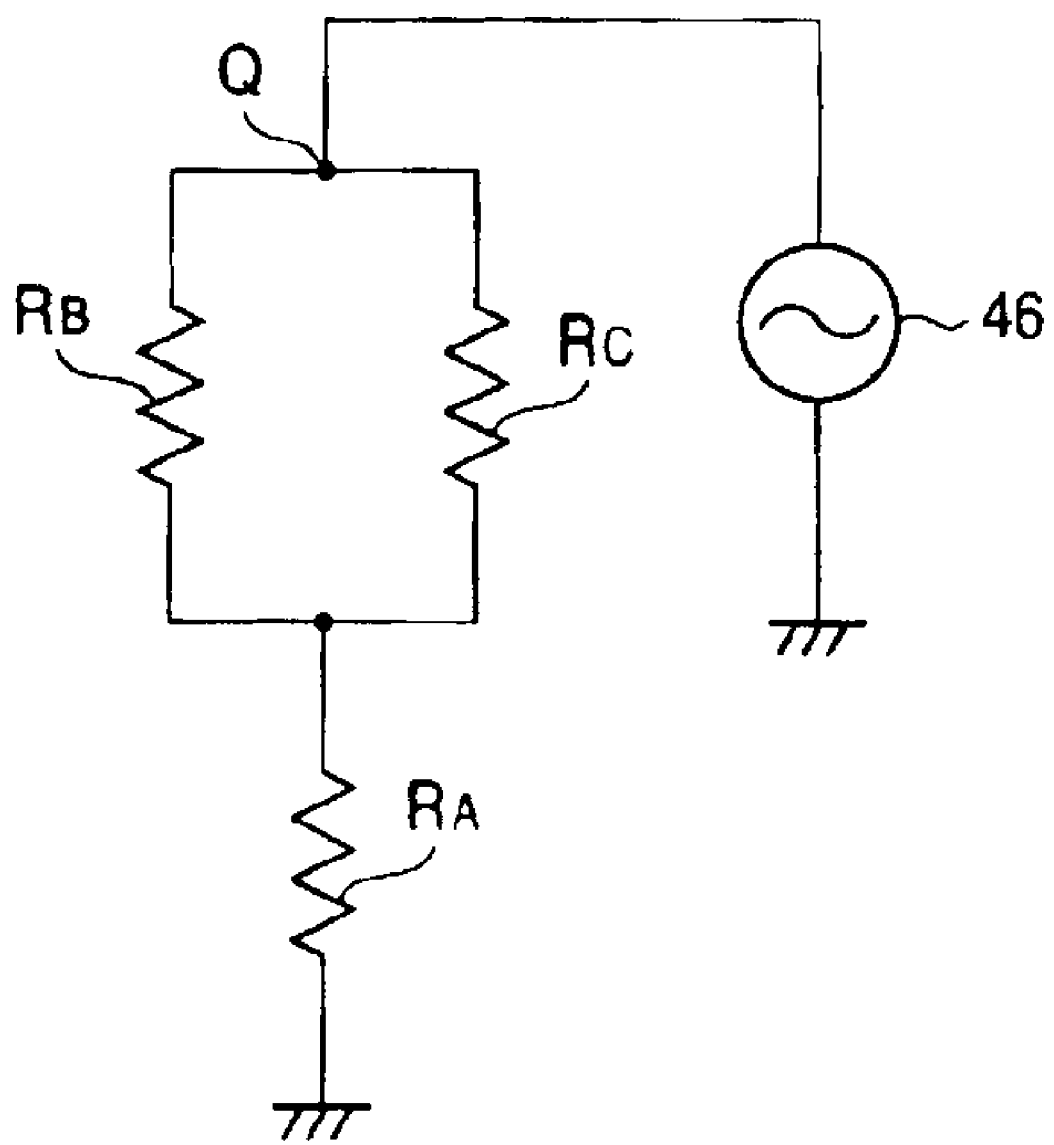
FIG. 5 is an equivalent circuit diagram at the time of measurement of the contact resistance.

Then, a voltage is measured with the voltmeter 48; from the measured voltage value and the current value supplied from the current supply 46, according to the Ohm's law, from the respective values of the contact resistances between the contact probes 16A through 16C and the electrode pads 40A through 40C, a total contact resistance value can be obtained. That is, when the values of the contact resistances between the probe 16A and the electrode pad 40A, the probe 16B and the electrode pad 40B, and the probe 16C and the electrode pad 40C are represented by $R_A$, $R_B$ and $R_C$, respectively, when paying attention only to the values of the contact resistance, an equivalent circuit can be shown as shown in FIG. 5. Accordingly, when a voltage at a point Q in the drawing is measured with the voltmeter 48, a contact resistance value $R_t$ of a whole equivalent circuit can be measured. When the contact resistance value $R_t$ of the equivalent circuit is equal to or more than a predetermined value, the table 20 is moved so that the probe may position on the cleaning stage 34, and thereby the cleaning is performed.

The predetermined value is set at a value that does not allow an accurate test when exceeding this value. Specifically, the predetermined value in the embodiment is set based on a resistance value provided in advance at the time of purchase or a resistance value first measured when a cleaned probe is brought into contact with an electrode pad of the semiconductor device to be actually electrically tested. The difference (margin) between the predetermined value and a resistance value to be a reference when the predetermined value is set is appropriately determined according to an operating voltage of the semiconductor device to be tested; the lower the operating voltage of the semiconductor device is, the larger an influence of a voltage drop accompanying an increase of the contact resistance is; accordingly, the difference between the predetermined value and a resistance value to be a reference is preferable to be set smaller.

Thus, in the probe card 18, the relay 38 that connects the probe 16A to the voltage supply 36 of the tester 14 at the time of test and grounds the probe 16A at the time of measurement of the contact resistance is disposed; accordingly, when the contact resistance is measured, there is no need of once disengaging the probe card 18 from the device and setting it to the dedicated device, and thereby measuring the contact resistance. Thereby, the inspection efficiency can be improved.

In the next place, as an operation of the embodiment, a control routine that the control portion 22 exerts during the measurement of the contact resistance will be explained with reference to a flowchart shown in FIG. 6.

Figure 6:
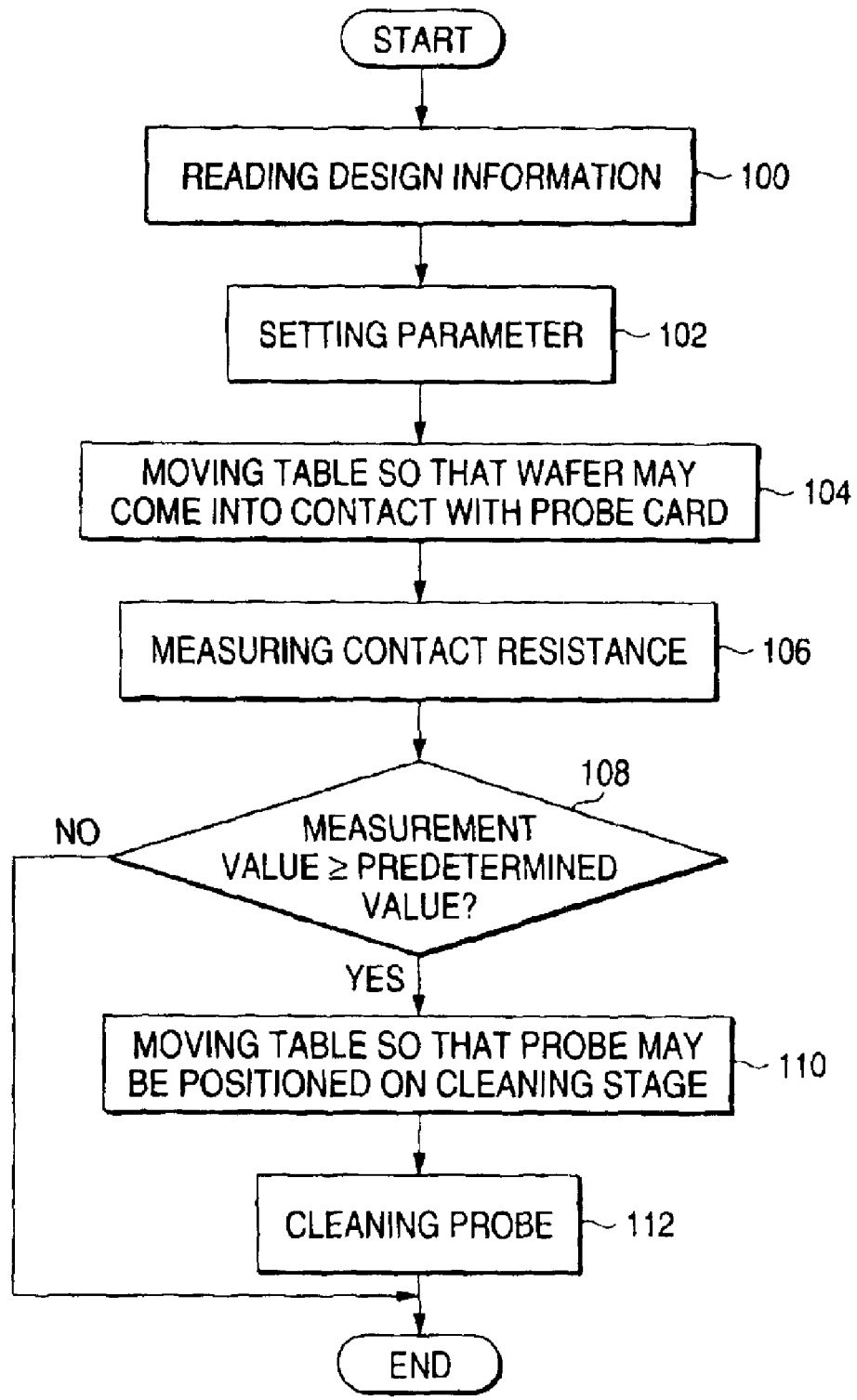
FIG. 6 is a flowchart showing a flow of a control routine at the time of measurement of the contact resistance.

The control routine shown in FIG. 6 may be performed every time when, for instance, the wafer 12 is tested, or may be periodically performed when the wafers 12 are tested the predetermined number of times.

First, in a step 100, design information of the wafer 12 to be tested stored in the memory portion 30 is read. The design information includes, for instance, positional information (coordinate information) of the electrode pads 40A through 40C thereto the probes 16A through 16C are to be brought into contact, and design information of the semiconductor device such as the operating voltage and so on of the semiconductor device to be tested.

Next, in the step 102, parameters necessary for measuring the contact resistance are set. The parameters includes, for instance, a value of current that the current supply 46 of the tester 14 supplies, and a predetermined value for judging whether the probe should be cleaned or not. The parameters, though determined in accordance with, for instance, the operating voltage of the semiconductor device, as an example, are set at 250 mA for the value of current supplied by the current supply 46, and substantially 10 Ω for the predetermined value.

The parameters may be automatically set from the correspondence between the operating voltage of the semiconductor device and the parameters that is stored in advance in the memory portion 30; however, values inputted by an operator from the operation portion 26 may be used.

Then, in the step 104, the wafer 12 is placed on the wafer stage 32, and the drive portion 24 is controlled based on the design information so as to move the table 20 so that the electrode pads 40A through 40C formed on the wafer 12 may come into contact with the probes 16A through 16C. Thereby, the drive portion 24 moves the table 20 and brings the electrode pads 40A through 40C into contact with the probes 16A through 16C, respectively.

Next, in the step 106, the contact resistance is measured. Specifically, the tester 14 is controlled so that a current of the predetermined value may be supplied from the power supply (current supply 46 of the tester 14) that is used when measuring the contact resistance to the probes 16B and 16C, and, at the same time, the relay 38 of the probe card 18 is controlled so that the probe 16A may be grounded.

Thereby, the current from the current supply 46 goes in turn through the probes 16B and 16C, the electrode pads 40B and 40C, the wiring 42, the electrode pad 40A, the probe 16A and the relay 38.

Then, a voltage is measured with the voltmeter 48; from the measured values of voltage and current, a value of total contact resistance $R_t$ is measured.

Next, in the step 108, whether the measured contact resistance value $R_t$ is equal to or more than the predetermined value or not, that is, whether the measured contact resistance value $R_t$ is one that does not allow an accurate test or not, is judged.

In the next place, when the contact resistance value $R_t$ is not equal to or more than the predetermined value, the judgment in the step 108 is negated, resulting in the completion of the present routine. That is, it is judged that the probe is not contaminated to the extent that does not allow the accurate test of the semiconductor device, that is, there is no need of cleaning the probe. As a result, without cleaning the probe, the next test is performed.

On the other hand, when the contact resistance value $R_t$ is equal to or more than the predetermined value, the judgment of the step 108 is approved followed by forwarding to the step 110.

In the step 110, the drive portion 24 is controlled so as to move the table 20 so that the probes 16A through 16C may be located on the cleaning stage 34. Thereby, the drive portion 24 moves the table 20 and the probes 16A through 16C are placed on the cleaning stage 34.

Then, in the step 112, the probes 16A through 16C are cleansed. Specifically, the table 20 is driven so that the cleaning stage 34 may press tip ends of the probes 16A through 16C. By repeating this several times, the tip ends of the probes 16A through 16C are polished with the cleaning stage 34; aluminum or the like adhered to the probes 16A through 16C can be removed. Accordingly, the contact resistance value returns to a normal state; that is, the semiconductor device can be accurately tested.

Thus, since the relay 38 that grounds the probe 16A at the time of measurement of the contact resistance is disposed, there is no need of once disengaging the probe card 18 from the device when measuring the contact resistance and setting it to the dedicated device to measure the contact resistance. Furthermore, the step of measuring the contact resistance can be automatically forwarded to the cleaning step. Accordingly, an inspection time can be shortened and inspection efficiency can be drastically improved. Still furthermore, since the contact resistance is measured with a semiconductor device to be actually tested, the contact resistance can be accurately measured. Furthermore, since there is no need of disposing a pad dedicated to the contact resistance measurement, it is suitable for multi-padding in the future.

In the embodiment, by supplying the current and measuring the voltage, the contact resistance is measured; however, by supplying the voltage and measuring the current, the contact resistance may be measured. However, when a current more than a definite value has flowed to the probe 16 that is contacted with the electrode pad 40, aluminum or the like on a surface of the electrode pad melts at the tip end of the probe 16. Accordingly, when the contact resistance is measured, a method in which an amount of the current that flows between the electrode pad 40 and the probe 16 can be easily controlled, that is, the current is flowed to measure the voltage, is preferably used.

Furthermore, in the first embodiment where the electrode pad of the semiconductor device thereto the power supply potential is supplied is used to measure the contact resistance, a power supply for use in test that is used when an electrical test of the semiconductor device is carried out and a power supply for use in measurement of the contact resistance that is used when the contact resistance between the electrode pad and the probe is measured may be the same power supply.

(Second Embodiment)

In the next place, a second embodiment according to the invention will be explained. To the portions same as that of the first embodiment, the same reference numerals are given, and detailed explanation thereof will be omitted.

Figure 7:
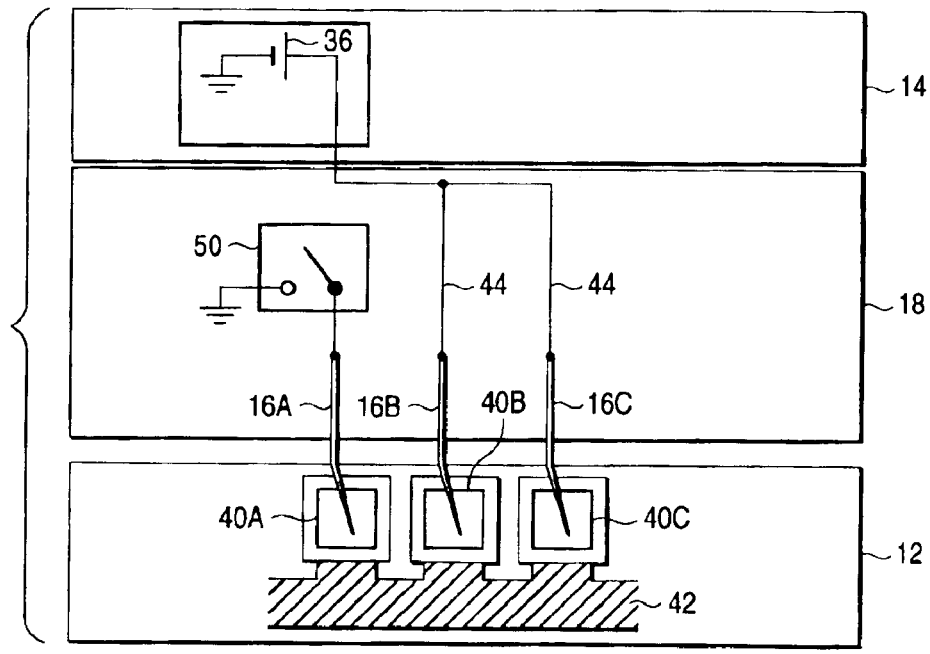
FIG. 7 is a diagram schematically showing connection relationship between a tester, a probe card, and an electrode pad of a semiconductor device at the time of test according to a second embodiment.

In FIG. 7, connection relationship, at the time of test of a wafer 12, of a tester 14, a probe card 18 and the wafer 12 is schematically shown.

Figure 8:
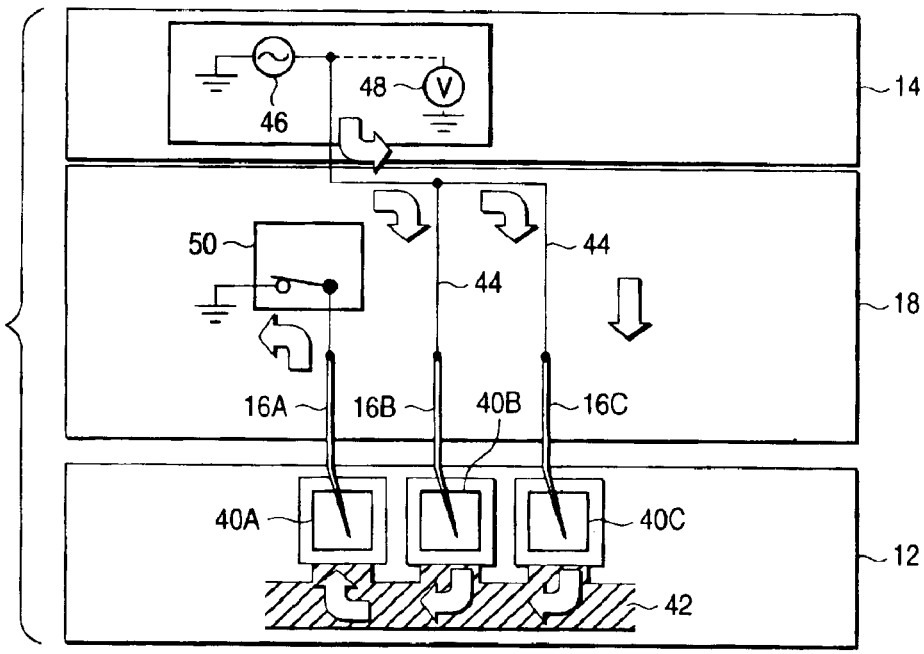
FIG. 8 is a diagram schematically showing connection relationship between a tester, a probe card, and an electrode pad of a semiconductor device at the time of contact resistance measurement according to a second embodiment.

A relay 50 disposed in the probe card 18 according to the embodiment, at the time of test of the wafer 12, does not connect a probe 16A to a voltage supply 36 of the tester 14 and sets open. On the other hand, at the time of measurement of the contact resistance, the relay 50, as shown in FIG. 8, grounds the probe 16A. The measurement of the contact resistance is similarly performed as in the first embodiment.

Thus, at the time of test of the wafer 12, the probe 16A is set open, that is, to a non-connected state; accordingly, there is no current flow to the probe 16A. Thereby, the probe 16A is less contaminated in comparison with the probes 16B and 16C.

As a result, since the contact resistance $R_A$ of the probe 16A is smaller in comparison with the contact resistances $R_B$ and $R_C$, practically only the contact resistances of the probes 16B and 16C can be measured; when the measurement is divided by two, the contact resistances only of the probe 16B and only of the probe 16C can be measured.

(Third Embodiment)

In the next place, a third embodiment according to the invention will be explained. In the embodiment, a case where contact resistance between a ground pad for use in grounding and a probe is measured will be explained. The portions same as that of the first embodiment are given the same reference numerals, and detailed explanation thereof will be omitted.

Figure 9:
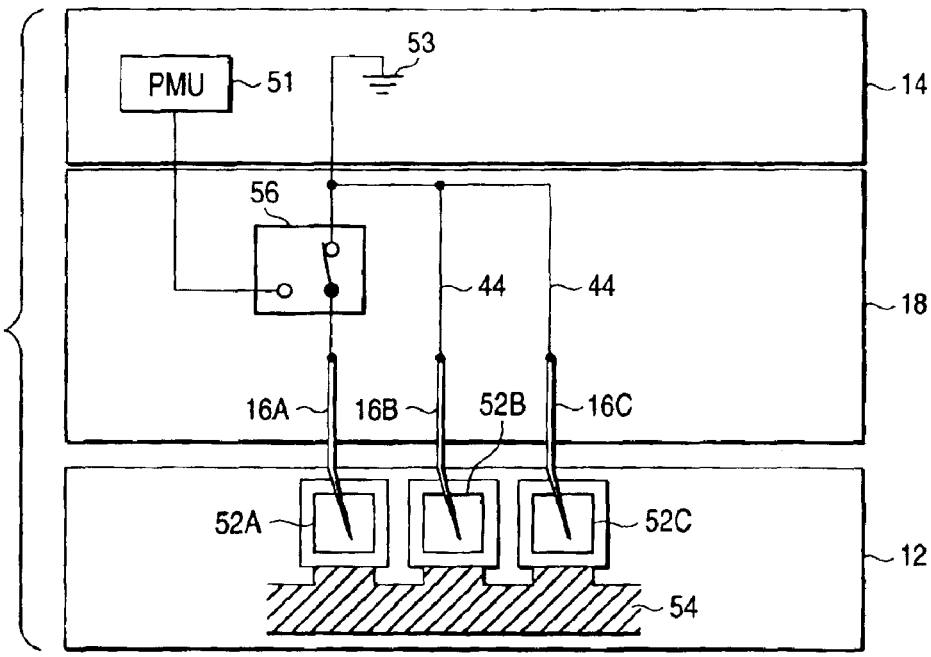
FIG. 9 is a diagram schematically showing connection relationship between a tester, a probe card, and an electrode pad of a semiconductor device at the time of test according to a third embodiment.

In FIG. 9, connection relationship, at the time of test of a wafer 12, of a tester 14, a probe card 18 and a wafer 12 is schematically shown.

The tester 14 includes a unit 51 that has functions of a current supply 46 and a voltmeter 48. Furthermore, the wafer 12 includes a plurality of ground pads 52A through 52C for use in grounding, and these are connected with a wiring 54.

Figure 10:
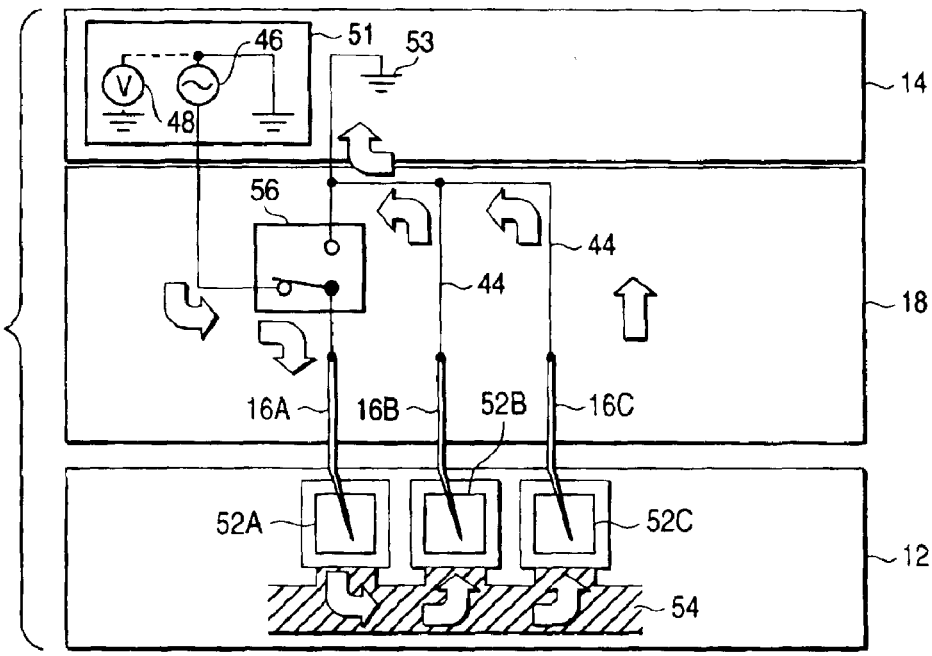
FIG. 10 is a diagram schematically showing connection relationship between a tester, a probe card, and an electrode pad of a semiconductor device at the time of contact resistance measurement according to a third embodiment.

A relay 56 disposed in the probe card 18, at the time of test, as shown in FIG. 9, grounds a probe 16A to grounding means 53, and, at the time of measurement of the contact resistance, as shown in FIG. 10, connects the probe 16A to the current supply 46 and allows it to function as a probe for use in the power supply.

Thereby, at the time of test of the wafer 12, the ground pads 52A through 52C come into contact with the corresponding probes 16A through 16C and are grounded.

The unit 51 and the grounding means 53 corresponds to a third power supply according to the invention, the probe 16A a first probe according to the invention, and the probes 16B and 16C a second probe according to the invention.

Figure 11:
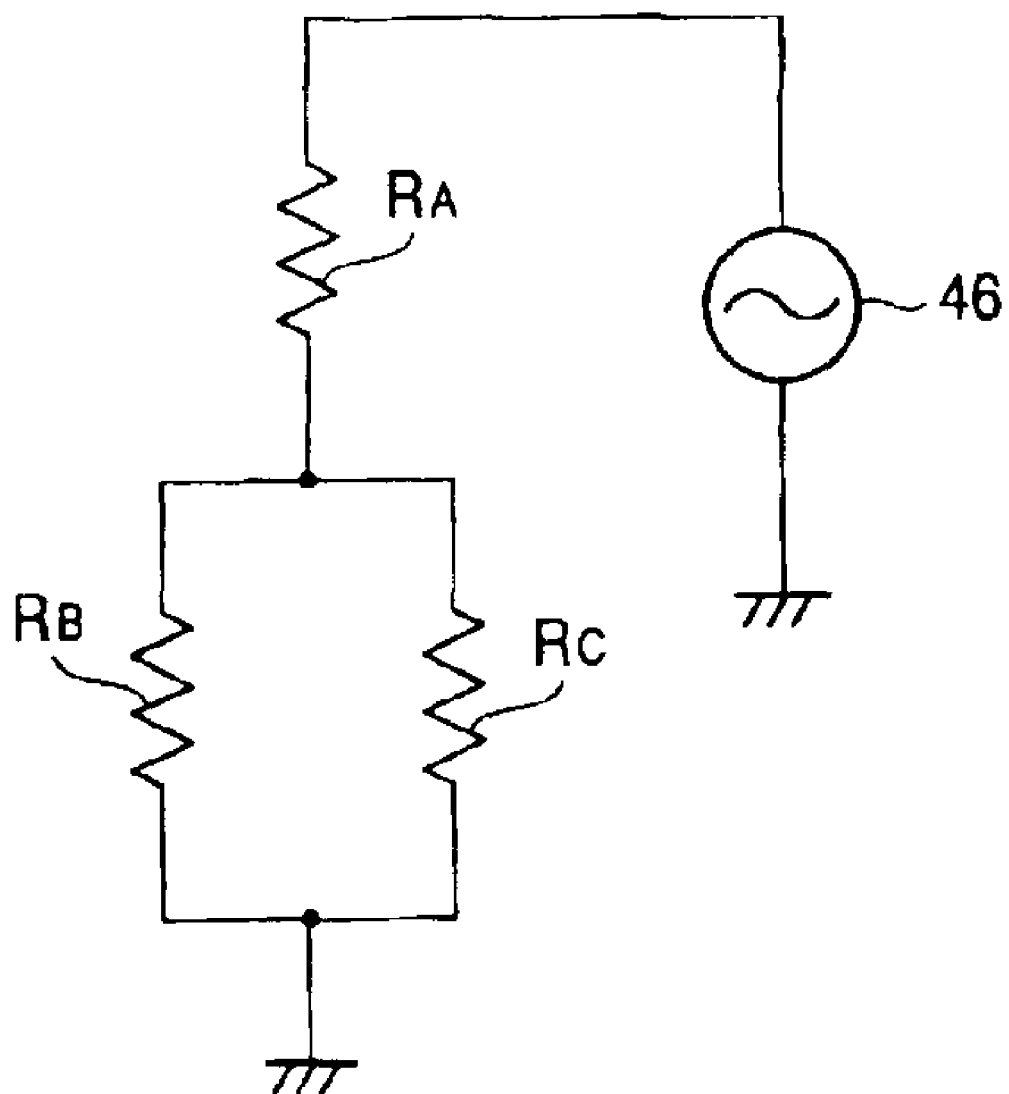
FIG. 11 is an equivalent circuit diagram at the time of contact resistance measurement.

At the time of measurement of the contact resistance, a current supplied from the current source 46 flows in turn through the relay 56, the probe 16A, the ground pad 52A, the wiring 54, the ground pads 52B and 52C, the probes 16B and 16C for use in the grounding probe, and the wiring 44. An equivalent circuit in this case becomes a circuit shown in FIG. 11.

Then, a voltage is measured with the voltmeter 48, and from the measurement and a value of flowed current, a value of the total contact resistance $R_t$ can be obtained.

Thus, since the relay 38 that grounds the probe 16A at the time of test and connects the probe 16A to the current supply 46 at the time of measurement of the contact resistance is disposed, there is no need of once disengaging the probe card 18 from the device and setting to the dedicated device to measure the contact resistance when measuring the contact resistance, and furthermore, the step of measuring the contact resistance can be automatically forwarded to the cleaning step, an inspection period of time can be shortened and an inspection efficiency can be drastically improved. Furthermore, since there is no need of disposing a pad dedicated to the contact resistance measurement, it is suitable for multi-padding in the future. Still furthermore, since the contact resistance is measured with a semiconductor device to be actually tested, the contact resistance can be accurately measured.

(Fourth Embodiment)

In the next place, a fourth embodiment according to the invention will be explained. To the portions same as that of the third embodiment, the same reference numerals are given, and detailed explanation thereof will be omitted.

Figure 12:
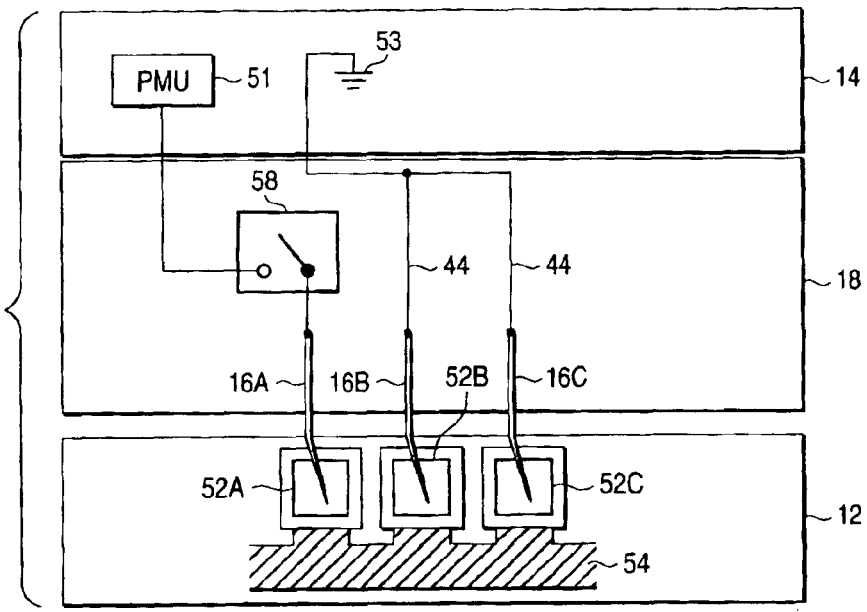
FIG. 12 is a diagram schematically showing connection relationship between a tester, a probe card, and an electrode pad of a semiconductor device at the time of test according to a fourth embodiment.

In FIG. 12, connection relationship, at the time of test of a wafer 12, of a tester 14, a probe card 18 and a wafer 12 is schematically shown.

Figure 13:
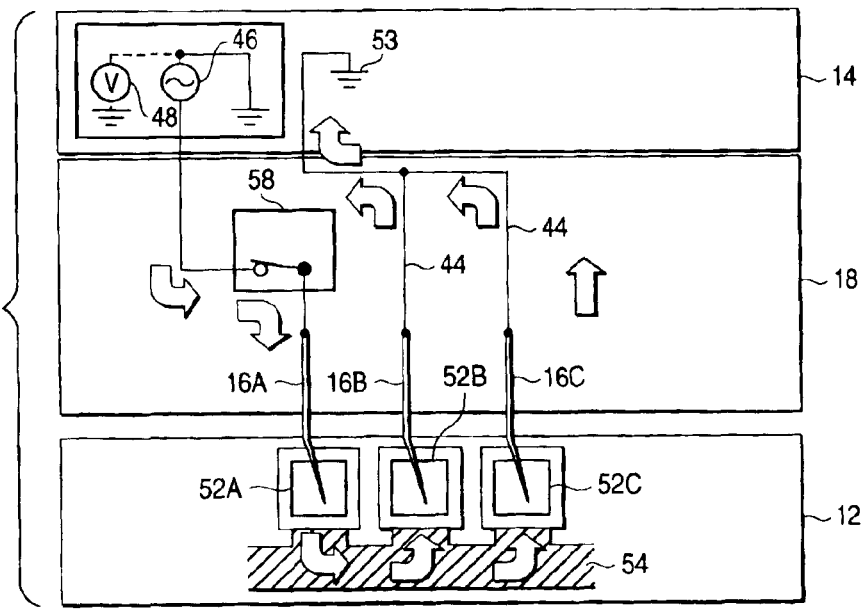
FIG. 13 is a diagram schematically showing connection relationship between a tester, a probe card, and an electrode pad of a semiconductor device at the time of contact resistance measurement according to a fourth embodiment.

A relay 58 disposed in a probe card 18 according to the embodiment, at the time of test of the wafer 12, set a probe 16A open, that is, a non-connected state. On the other hand, when the contact resistance is measured, the relay 58, as shown in FIG. 13, connects the probe 16A to a current source 46. The contact resistance is measured similarly to the first embodiment.

Thus, at the time of test of the wafer 12, the probe 16A becomes an open, that is, non-connected state; accordingly, there is no current flow to the probe 16A. Thereby, the probe 16A is less contaminated in comparison with the probes 16B and 16C.

As a result, since the contact resistance $R_A$ of the probe 16A is smaller in comparison with the contact resistances $R_B$ and $R_C$, practically only the contact resistances of the probes 16B and 16C can be measured; when the measurement is divided by two, the contact resistances of only the probe 16B and only the probe 16C can be measured.

As explained above, according to the invention, there are effects in that the lowering of the test efficiency can be suppressed from occurring, and the value of the contact resistance can be accurately measured.

What is claimed is:

1. A method of testing a semiconductor device, including:
   bringing a plurality of probes including a first probe and a second probe into contact with a plurality of electrode pads that are disposed on a semiconductor device and connected each other with a conductive wiring;
   connecting a first power supply to the first probe and supplying a current or a voltage from the first probe through the electrode pads and the wiring to the second probe;
   measuring contact resistance between the electrode pads and the probes based on the current or the voltage supplied to the semiconductor device; and
   judging whether the measured contact resistance is equal to or more than a predetermined value or not, and, when the contact resistance is less than the predetermined value, carrying out an electrical test of the semiconductor device.

2. A method of testing a semiconductor device as set forth in claim 1, wherein when the semiconductor device is subjected to an electrical test, a second power supply that supplies a source potential is connected to each of the first probe and the second probe, the source potential is supplied from the first probe and the second probe to the electrode pad, and thereby the test is carried out.

3. A method of testing a semiconductor device as set forth in claim 1, wherein when the semiconductor device is subjected to an electrical test, the first probe is connected to a second power supply that supplies a source potential, the second probe is non-connected to the second power supply, thereby the source potential is supplied from the first probe to the electrode pad, and thereby the test is carried out.

4. A method of testing a semiconductor device as set forth in claim 2, wherein the first power supply and the second power supply are the same power supply.

5. A method of testing a semiconductor device as set forth in claim 1, wherein when the semiconductor device is subjected to an electrical test, a third power supply that supplies a ground potential is connected to each of the first probe and the second probe, thereby the ground potential is supplied from the first probe and the second probe to the electrode pads, and thereby the test is carried out.

6. A method of testing a semiconductor device as set forth in claim 1, wherein when the semiconductor device is subjected to an electrical test, the second probe is connected to a third power supply that supplies a ground potential; the first probe is non-connected to the third power supply; the ground potential is supplied from the second probe to the electrode pad; and thereby the test is performed.

7. A method of testing a semiconductor device as set forth in claim 1, further including:
   cleaning the plurality of probes when the measured contact resistance is judged to be equal to or more than a predetermined value; and
   carrying out an electrical test of the semiconductor device with the cleansed probes.

8. A method of testing a semiconductor device as set forth in claim 7, further including:
   prior to bringing the probe into contact, disposing the semiconductor device on a supporting area in a prober having the supporting area that supports the semiconductor device and a cleaning area that cleanses the probe;
   wherein the testing and the cleaning are carried out in a same prober.

9. A method of testing a semiconductor device as set forth in claim 1, wherein the measuring the contact resistance is performed after a plurality of semiconductor devices are subjected to an electrical test.

10. A method of testing a semiconductor device, comprising:
    providing a semiconductor device having a plurality of power supply pads electrically connected to each other, and a probe device having a plurality of probes;
    contacting the power supply pads with the probes so as to be electrically connected therebetween;
    connecting one of the probes with a current source and another one of the probes with a ground;
    measuring a contact resistance based on a voltage of the one of the probes connected to the voltage source; and
    conducting a test of the semiconductor device when the measured contact resistance is less than a predetermined value.

11. A method of testing a semiconductor device according to claim 10, wherein the proves are connected to a voltage source during the test of the semiconductor device.

12. A method of testing a semiconductor device according to claim 11, wherein the voltage source supplies a power supply voltage.

13. A method of testing a semiconductor device according to claim 11, wherein the voltage source supplies a ground voltage.

14. A method of testing a semiconductor device, comprising:
    providing a semiconductor device having a plurality of power supply pads electrically connected to each other, and a probe device having a plurality of probes;
    contacting the power supply pads with the probes so as to be electrically connected therebetween;
    connecting one of the probes with a voltage source and another one of the probes with a ground;
    measuring a contact resistance based on a current of the one of the probes connected to the voltage source; and
    conducting a test of the semiconductor device when the measured contact resistance is less than a predetermined value.

15. A method of testing a semiconductor device according to claim 14, wherein the probes are connected to a voltage source during the test of the semiconductor device.

16. A method of testing a semiconductor device according to claim 15, wherein the voltage source supplies a power supply voltage.

17. A method of testing a semiconductor device according to claim 15, wherein the voltage source supplies a ground voltage.

* * * * *